United States Patent

Kobayashi et al.

Patent Number: 5,308,743
Date of Patent: May 3, 1994

[54] POSITIVE IMAGE-FORMING PROCESS UTILIZING GLASS SUBSTRATE WITH OXIDE FILM OF INDIUM-TIN ALLOY, COATED WITH O-QUINONEDIAZIDE PHOTORESIST, WITH ETCHING OF THE OXIDE FILM IN THE IMAGEWISE EXPOSED AREAS

[75] Inventors: Kesanao Kobayashi; Nobuaki Matsuda, both of Shizuoka, Japan

[73] Assignee: Fuji Photo Film Co., Ltd., Kanagawa, Japan

[21] Appl. No.: 845,833

[22] Filed: Mar. 6, 1992

Related U.S. Application Data

[63] Continuation of Ser. No. 545,022, Jun. 28, 1990, abandoned.

[30] Foreign Application Priority Data

Jun. 29, 1989 [JP] Japan .................. 1-167973

[51] Int. Cl.$^5$ .......................... G03F 7/30; G03F 7/40
[52] U.S. Cl. .................................. 430/318; 430/166; 430/191; 430/275; 430/323; 430/326
[58] Field of Search ........... 430/191, 192, 193, 326, 430/165, 166, 275, 318, 323

[56] References Cited

U.S. PATENT DOCUMENTS

| | | | |
|---|---|---|---|
| 4,271,251 | 6/1981 | Aotani et al. | 430/192 |
| 4,279,982 | 7/1981 | Iwasaki et al. | 430/191 |
| 4,853,314 | 8/1989 | Ruckert et al. | 430/278 |
| 4,963,463 | 10/1990 | Koshiba et al. | 430/191 |

*Primary Examiner*—Charles L. Bowers, Jr.
*Assistant Examiner*—Christopher G. Young
*Attorney, Agent, or Firm*—Sughrue, Mion, Zinn, Macpeak & Seas

[57] ABSTRACT

A positive-type photoresist composition is disclosed, which comprises:
(A) an o-quinonediazide compound;
(B) an alkali-soluble phenol resin; and
(C) at least one compound selected from a group consisting of urea compounds, thiourea compounds and arylamine compounds; A positive-type photoresist composition which comprises:
(A) an o-quinonediazide compound;
(B) an alkali-soluble phenol resin; and
(C) at least one compound selected from a group consisting of urea compounds, thiourea compounds, and arylamine compounds represented by general formulae (I), (II) and (III), respectively,

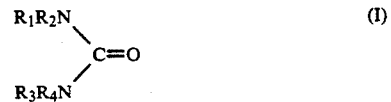

(I)

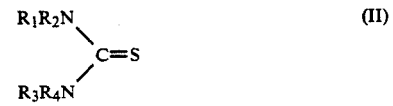

(II)

wherein $R_1$, $R_2$, $R_3$, and $R_4$ each represents a hydrogen atom, an alkyl group, an aryl group, or any two of $R_1$, $R_2$, $R_3$, and $R_4$ form at least one ring together,

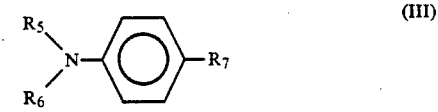

(III)

wherein $R_5$, $R_6$, and $R_7$ each represents a hydrogen atom, an alkyl group having from 1 to 8 carbon atoms, a hydroxyalkyl group having from 1 to 8 carbon atoms, a phenyl group unsubstituted or substituted with halogen atom(s), or a naphthyl group unsubstituted or substituted with halogen atom(s).

11 Claims, 1 Drawing Sheet

POSITIVE IMAGE-FORMING PROCESS UTILIZING GLASS SUBSTRATE WITH OXIDE FILM OF INDIUM-TIN ALLOY, COATED WITH O-QUINONEDIAZIDE PHOTORESIST, WITH ETCHING OF THE OXIDE FILM IN THE IMAGEWISE EXPOSED AREAS

This is a continuation of application Ser. No. 07/545,022 filed Jun. 28, 1990 now abandoned.

FIELD OF THE INVENTION

This invention relates to a positive-type photoresist composition useful for the production of semiconductors and electronic devices such as liquid crystal display devices, fluorescent display tubes, thermal heads and image sensors. More particularly, it relates to a positive-type photoresist composition suitable for fine processing.

BACKGROUND OF THE INVENTION

Among the characteristics of photoresists to be used in fine processing for the production of semiconductors and electronic devices such as liquid crystal devices, fluorescent display tubes, thermal heads and image sensors, adhesiveness to the surface of a base board to be etched is particularly important. Common positive-type photoresists frequently suffer from peeling or undercut caused by wet-etching with a strong acid or a weak base. It has been attempted, therefore, to treat the surface of a base board to be etched with, for example, hexamethyldisilazane so as to improve the adhesiveness. However such a treatment does not provide a satisfactory effect. It has been further attempted to heat a base board before or after the application of a positive-type resist or after development, though the effect thus achieved is limited.

JP-B-50-9177, JP-B-54-5292 and JP-A-53-702 each disclose a method for the improvement of the adhesiveness to the copper surface of a print base board (the terms "JP-B" and "JP-A" as used herein respectively mean an "examined Japanese patent publication" and an "unexamined published Japanese patent application"). However each of the disclosed photosensitive materials is the negative-type photoresist which is exclusively applicable to a copper base board.

In the field of fine processing, positive-type microphotoresists having high resolving power have been mainly employed. However no effective additive such as an adhesion aid for positive-type photoresists has yet been known. In the field of processing electronic devices such as displays or thermal heads, wherein base boards made of various materials are employed, no effective additive has been found thus far, since the adhesiveness of the photoresist would vary depending up on the base boards used.

SUMMARY OF THE INVENTION

Accordingly, it is an object of the present invention to provide a positive-type photoresist composition which has an excellent adhesiveness to various base boards, including in particular, an ITO (Indium-Tin-alloy oxide) base board.

The present invention has been completed based on a finding that the above-mentioned problems can be effectively solved by adding at least one adhesion aid compound selected from among urea compounds, thiourea compounds, and arylamine compounds to a positive-type photoresist composition comprising an o-quinonediazide compound and an alkali-soluble phenol resin.

Namely, the object of the present invention has been achieved by providing a positive-type photoresist composition which comprises:

(A) an o-quinonediazide compound;
(B) an alkali-soluble phenol resin; and
(C) at least one compound selected from a group consisting of urea compounds, thiourea compounds and arylamine compounds represented by the following general formulae (I), (II) and (III), respectively:

wherein $R_1$, $R_2$, $R_3$, and $R_4$ (which may be either the same or different) each represents a hydrogen atom, an alkyl group, an aryl group or any two of $R_1$, $R_2$, $R_3$, and $R_4$ form at least one ring together;

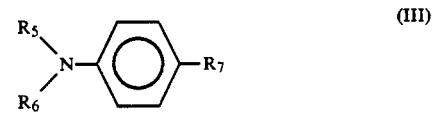

wherein $R_5$, $R_6$, and $R_7$ (which may be the same or different) each represents a hydrogen atom, an alkyl group having from 1 to 8 carbon atoms, a hydroxyalkyl group having from 1 to 8 carbon atoms, a phenyl group unsubstituted or substituted with halogen atom(s) or a naphthyl group unsubstituted or substituted with halogen atom(s).

DETAILED DESCRIPTION OF THE INVENTION

Figure 1:
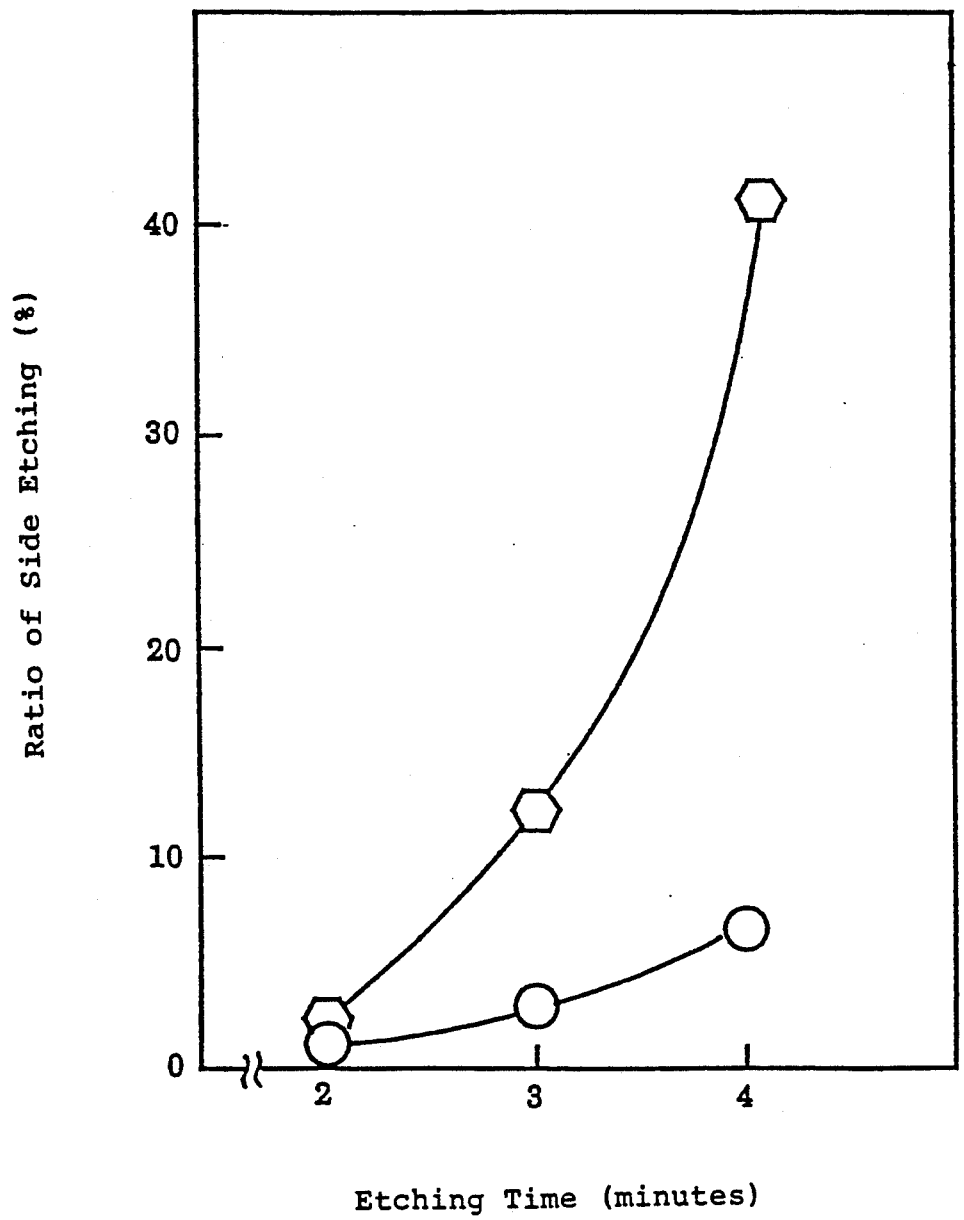
FIG. 1 shows a relationship between etching time (minute) and the ratio (%) of side etching in the etching of an ITO base board, wherein ○ represents a resist of the invention containing 1,3-dimethylurea, while ⬭ represents a conventional one containing no 1,3-dimethylurea.

As the o-quinonediazide compound, namely, the component (A) to be used in the present invention, 1,2-naphthoquinone-2-diazide-5-sulfonate of trihydroxybenzophenone is preferably used, though the present invention is not restricted thereby.

In addition to this compound, those disclosed, for example, in JP-B-43-28,403, U.S. Pat. Nos. 2,754,209, 3,046,110, 3,046,112, 3,046,113, 3,046,116, 3,046,118, 3,046,119, 3.046,120, 3,647,443 and 3,759,711 are also useful in the present invention. Among these compounds, 1,2-naphthoquinonediazide-5(or-4)-sulfonate of 2,3,4,4'-tetrahydroxybenzophenone, 2,3,4,2',6'-pentahydroxybenzophenone, 2,4,6,3',4',5-hexahydroxybenzophenone and 2,3,4,5,4'-pentahydroxybenzophenone are particularly preferable.

Preferable examples of the alkali-soluble phenol resin, namely, the component (B) to be used in the present invention include a novolak resin or resol resin, of phenol/formaldehyde resins described in "Synthetic Resin in Coatings", Chapter 15 (H.P. Preuss, Noyes Development Corporation, 1965, Pearl River, N.Y.). A novolak resin or a resol resin is synthesized by condensing a phenolic compound with an aldehyde respectively, in the presence of an acidic catalyst or a basic catalyst. Furthermore, those obtained by substituting the phenol with, for example, cresol, xylenol, ethylphenol, butylphenol, isopropylmethoxyphenol, chlorophenol, hydroquinone, naphthol, 2,2-bis(p-hydroxyphenol)propane may be used.

The present invention is characterized by using at least one compound selected from a group consisting of urea compounds, thiourea compounds and arylamine compounds. The combined use of said compound with an o-quinonediazide compound and an alkali-soluble phenol resin would improve the wetting characteristics of the obtained composition on a base board, thus substantially elevating the adhesiveness thereof. Examples of the component (C) to be used in the present invention include urea compounds such as urea, methyl urea, ethyl urea, phenyl urea, allyl urea, benzoyl urea, acetyl urea, ethylene urea, 1,1-dimethyl urea, 1,3-dimethyl urea, 1,1-diethyl urea, 1,3-diethyl urea, 1,3-diphenyl urea, 1,3-diallyl urea, 1,3-dicyclohexyl urea, 1,3-diacetyl urea, 1,1-dibenzoyl urea, trimethyl urea, triethyl urea, triphenyl urea, tetramethyl urea and tetraethyl urea, thiourea compounds such as thiourea, methyl thiourea, 1-phenyl-2-thiourea, 1-allyl-2-thiourea,1-benzoyl-2-thiourea, 1-acetyl-2-thiourea, 1-(1-naphthyl)-2-thiourea, guanyl thiourea, 1,3-dimethyl thiourea, 1,3-diethyl thiourea, 1,1-diphenyl thiourea, 1,3-diphenyl thiourea, 1,3-di-n-butyl thiourea, 1,3-dicyclohexyl thiourea, 1,3-diisopropyl thiourea, 2,2'-ditolyl thiourea, 4,4'-ditolyl thiourea, trimethyl thiourea, triethyl thiourea, triphenyl thiourea, tetramethyl thiourea, tetraethyl thiourea and tetraphenyl thiourea, and arylamine compounds such as N-methyl-o-toluidine, N-methyl-m-toluidine, N-methyl-p-toluidine, N-ethyl-o-toluidine,N-ethyl-m-toluidine, N-ethyl-p-toluidine, dimethyl-o-toluidine, dimethyl-m-toluidine, dimethyl-p-toluidine, di-ethyl-o-toluidine, diethyl-m-toluidine, diethyl-p-toluidine, N-methylaniline, N-ethylaniline, N-pentylaniline, N-allylaniline, dimethylaniline, diethylaniline, di-propylaniline, di-n-butylaniline, dibenzylaniline, N-phenylbenzylamine, N-phenyl-1-naphthylamine, N-phenyl-2-naphthylamine, N-ethyl-1-naphthylamine, dimethyl-1-naphthylamine, dimethyl-2-naphthylamine, diethyl-1-naphtylamine, dimethyl-2-naphthylamine, diethyl-1-naphthylamine, N-phenyl-diethanolamine, N-phenyl-di-2-propanolamine, m-tolyl-diethanolamine, and p-tolyl-diethanolamine. The present invention is not, however, limited by the either one of these compounds or a mixture thereof used in the present invention.

In the urea compounds and thiourea compounds represented by the general formulae (I) and (II), the alkyl group represented by $R_1$, $R_2$, $R_3$ or $R_4$ has from 1 to 8 carbon atoms, which may be substituted by a substituent such as, a hydroxy group, a halogen atom and a hydroxyalkyl group having from 1 to 3 carbon atoms. The aryl group represented by $R_1$, $R_2$, $R_3$ or $R_4$ has 14 or less of carbon atoms, which may be substituted by from 1 to 3 substituents, such as, a hydroxy group, a halogen atom, an alkyl group having from 1 to 3 carbon atoms and a hydroxy alkyl group having from 1 to 3 carbon atoms.

Any two of $R_1$, $R_2$, $R_3$ and $R_4$, for example, ($R_1$ and $R_2$), ($R_3$ and $R_4$), ($R_1$ and $R_2$, and $R_3$ and $R_4$) or ($R_1$ or $R_2$ and $R_3$ or $R_4$) may form one or two rings together.

However, in the compounds represented by formulae (I) and (II), it is preferred that $R_1$, $R_2$, $R_3$ and $R_4$ compose no ring each other, i.e., the urea compound and the thio urea compound have no ring structure.

In the compounds represented by formula (III), the phenyl group represented by $R_5$, $R_6$ or $R_7$ may be substituted with halogen atom(s), preferably from 1 to 3 halogen atoms on each phenyl group.

In the present invention, the components (A) to (C) may be employed at an arbitrary ratio. It is preferable, however, that the weight ratio of (A)/(B) ranges from 1/9 to 6/4, and is preferably from 2/8 to 4/6. Furthermore, it is preferable to use the component (C) in an amount of from 0.02 to 5% by weight, and more preferably from 0.05 to 3% by weight, based on the total solid content of the components (A) and (B).

The photosensitive composition of the present invention may be generally used in the form of a solution in an organic solvent having a concentration of the components (A) to (C) of from 10 to 80% by weight, and preferably from 20 to 60% by weight in total.

It is preferable to select a solvent having an appropriate boiling point in which each component can be uniformly dissolved. From another point of view, the solvent may be appropriately selected by considering the wetting characteristics, spreadability of the resulting solution and the characteristics of the coated layer upon coating with, for example, a spinner. Typical examples of the solvent are as follows. Either one of these solvents or a mixture thereof may be used. Namely, it is useful to select glycol ether solvents such as methyl cellosolve, ethyl cellosolve, propyl cellosolve, propylene glycol methyl ether, propylene glycol ethyl ether, propylene glycol propyl ether and acetates thereof, namely, methyl cellosolve acetate, ethyl cellosolve acetate, propyl cellosolve acetate, propylene glycol methyl ether acetate, propylene glycol ethyl ether acetate, and propylene glycol propyl ether acetate; acetate solvents such as amyl acetate, butyl acetate, propyl acetate and ethyl acetate; and ketone solvents such as methyl isobutyl ketone, methyl ethyl ketone, acetone, cyclohexanone, dimethylforamide, dimethylsulfoxide, methylpyrrolidone, γ-butyllacetone and ethyl lactate. The alkyl group may be either straight-chain or branched.

The positive-type photoresist composition of the present invention may further contain various additives selected from among colorants such as dye and pigment, photochromic compounds, burning agents such as a combination of a compound capable of evolving an acid upon photo-exposure and a pH indicator and coating improvers such as surfactant.

The positive-type photoresist composition of the present invention is applied onto films of metals belonging to Group IIIa or IVa of the Periodic Table or metal oxides thereof. These films are usually formed on insulating base boards such as glass, polyester film or ceramic by vacuum evaporation, plating or coating and comprise In, Ti, Ge, Sn, Pb, Sb, Ga, Al, oxides thereof, mixtures of these metals or mixtures of the oxides. In particular, the oxide of an In/Sn alloy is important as a transparent electrode.

The positive-type photoresist composition of the present invention may be applied onto a base board comprising the metal(s) or the thin metal oxide layer(s) thereon with the use of, for example, a roll coater, spinner or spray apparatus so as to give a coating thickness of several microns. Next, the coated film is exposed to light, developed and etched in a conventional manner to thereby provide a desired pattern.

According to the present invention, the peeling and side etching of a resist are relieved, which makes fine etching possible and extremely improves the workability. Namely, the use of the positive-type photoresist composition of the present invention enables fine etching (for example, complicated pattern, high density, fine structure) and widens the range of the concentration of an etching solution, the working temperature range and the baking temperature range. Furthermore, it makes it possible to select an effective etching agent or appropriate etching conditions to thereby speed up the etching process. As a result, the throughput of the process can be elevated.

The present invention will now be illustrated in more detail by reference to the following examples. However, the present invention should not be construed as being limited to these examples.

EXAMPLE 1 AND COMPARATIVE EXAMPLE 1

A glass base board (100×100 mm) provided with a vacuum evaporated ITO film (5000 A) was immersed in a 0.2% aqueous solution of NaOH for 5 minutes followed by washing with water and drying. After cooling, positive-type photoresist solutions a (the invention product) and b (comparative one of the following compositions) were each applied onto the surface of the ITO film with a roller coater (mfd. by Dainippon Screen Mfg. Co., Ltd.) to thereby provide a coating thickness of 1.5 μm.

| Positive-type photoresist solution $^a$ (the invention product): | |
|---|---|
| 1,2-Naphthoquinone-2-diazide-5-sulfonate of trihydroxybenzophenone (average esterification degree: 1.5) | 8% by weight |
| Cresol formaldehyde resin (weight average molecular weight: 8,000) | 25% by weight |
| Cellosolve acetate | 67% by weight |
| 1,3-Dimethyl urea | 1% by weight (based on solid content) |
| Positive-type photoresist solution b (comparative product): | |
| 1,2-Naphthoquinone-2-diazide-5-sulfonate of trihydroxybenzophenone (average esterification degree: 1.5) | 8% by weight |
| Cresol formaldehyde resin (weight average molecular weight: 8,000) | 25% by weight |
| Cellosolve acetate | 67% by weight |

These samples were UV-irradiated with the use of a 250 W ultrahigh-pressure mercury lamp (PLA-501F; mfd. By Canon Inc.) via a patterned photomask. Next, each sample was developed by dipping in a 0.5% aqueous solution of NaOH at 23° C. for 60 seconds, washed with water, rinsed and dried to thereby provide a resist pattern.

Next, the ITO film was selectively etched by dipping in a etching solution, which had been prepared by mixing HCl (35%), FeCl$_3$ (35%) and purified water at a ratio by volume of 8:1:1, and then the resist pattern was dissolved and peeled in acetone to thereby form a ITO pattern.

As a result, the ITO pattern of the sample coated with the solution of the invention $^a$ containing 1,3-dimethyl-urea was highly smooth and showed little decrease in line width. Thus it was largely superior to the ITO pattern of the sample coated with the solution b containing no 1,3-dimethyl urea in adhesiveness.

FIG. 1 shows a relationship between etching time and the ratio of side etching.

EXAMPLE 2

The procedure of Example 1 was repeated except that N,N-diethyl-p-toluidine was was substituted for the 1,3-dimethyl urea. As a result, a high adhesiveness and excellent ITO pattern characteristics were achieved, similar to Example 1.

EXAMPLE 3

The procedure of Example 1 was repeated except that N-phenyldiethanolamine was substituted for the 1,3-dimethyl urea. As a result, a high adhesiveness and excellent ITO pattern characteristics were achieved. Furthermore, no decrease in sensitivity was observed, similar to Example 1.

While the invention has been described in detail and with reference to specific embodiments thereof, it will be apparent to one skilled in the art that various changes and modifications can be made therein without departing from the spirit and scope thereof.

What is claimed is:

1. An image-forming process which comprises (a) applying a positive-type photoresist onto a board comprising an oxide film of an indium-tin alloy provided on a base board of glass, (b) image-wise exposing, (c) developing with a developing solution to remove the image-wise exposed areas of the positive-type photoresist, and (d) etching the oxide film of the indium-tin alloy in the developed photoresist areas with an etching solution, wherein said positive-type photoresist substantially comprises:

(A) an o-quinonediazide compound;
(B) an alkali-soluble phenol resin; and
(C) at least one compound selected from the group consisting of urea compounds, thiourea compounds, arylamine compounds represented by the general formulae (I), (II) and (III), respectively:

wherein $R_1$, $R_2$, $R_3$, and $R_4$ each represents a hydrogen atom, an alkyl group, an aryl group or any two of $R_1$, $R_2$, $R_3$, and $R_4$ form at least one ring together;

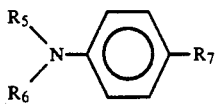

wherein $R_5$, $R_6$, and $R_7$ each represents a hydrogen atom, an alkyl group having from 1 to 8 carbon atoms, a hydroxyalkyl group having from 1 to 8 carbon atoms, a phenyl group unsubstituted or substituted with halogen atom(s), or a naphthyl group unsubstituted or substituted with halogen atom(s); and said component (C) is present in an amount of from 0.02 to 5.0% by weight based on the total solid content of components (A) and (B).

2. An image-forming process as in claim 1, wherein component (C) is a urea compound.

3. An image-forming process as in claim 1, wherein component (C) is a thiourea compound.

4. An image-forming process as in claim 1, wherein component (C) is a arylamine compound.

5. An image-forming process as in claim 1, wherein the urea compound and the thiourea compound have no ring structure.

6. An image-forming process as in claim 1, wherein the weight ratio of (A)/(B) ranges from 1/9 to 6/4.

7. An image-forming process as in claim 1, wherein the component (C) is used in an amount of from 0.05 to 3% by weight based on the total solid content of the components (A) and (B).

8. An image-forming process as in claim 1, wherein the weight ratio of (A)/(B) ranges from 2/8 to 4/6.

9. An image-forming process as in claim 8, wherein the component (C) is used in an amount of from 0.05 to 3% by weight based on the total solid content of the components (A) and (B).

10. An image-forming process as in claim 1, wherein the composition exists in a form of a solution of an organic solvent having a concentration of components (A) to (C) of from 10 to 80% by weight.

11. An image-forming process as in claim 1, wherein the composition exists in a form of a solution of an organic solvent having a concentration of components (A) to (C) of from 20 to 60% by weight.

* * * * *